United States Patent [11] 3,624,587

[72] Inventor Albert R. Conrad
Thousand Oaks, Calif.
[21] Appl. No. 9,632
[22] Filed Feb. 9, 1970
[45] Patented Nov. 30, 1971
[73] Assignee Litton Systems, Inc.
Beverly Hills, Calif.

[54] CLINCHED-WIRE INTERCONNECTION DEVICE FOR PRINTED CIRCUIT BOARDS
10 Claims, 5 Drawing Figs.

[52] U.S. Cl. .......... 339/17 M, 174/68.5, 339/17 L, 339/75 MP, 339/176 MP
[51] Int. Cl. .......... H05k 1/02
[50] Field of Search .......... 339/17 R, 17 B, 17 C, 17 L, 17 LC, 17 LM, 17 M, 17 F, 75 MP, 176 MP, 176 MF; 317/101; 174/68.5

[56] References Cited
UNITED STATES PATENTS

| | | | |
|---|---|---|---|
| 2,707,272 | 4/1955 | Blitz .......... | 339/17 LM |
| 3,200,020 | 8/1965 | Schroeder .......... | 339/17 B X |
| 3,366,914 | 1/1968 | McManus et al. .......... | 339/17 C |
| 3,417,362 | 12/1968 | Reynolds .......... | 339/17 F X |

*Primary Examiner*—Marvin A. Champion
*Assistant Examiner*—Terrell P. Lewis
*Attorneys*—Alan C. Rose, Alfred B. Levine, Ronald W. Reagin, John G. Mesaros and Lawrence V. Link, Jr.

ABSTRACT: The disclosed connector is adapted for directly mounting and electrically interconnecting printed circuit boards. Loops of resilient conductive wire project into openings in a receiving printed circuit board such that oppositely disposed pairs of these loops in each opening engage fingerlike insertion strips of a mating printed circuit board.

INVENTOR.
ALBERT R. CONRAD
BY
Lawrence V. Link Jr.
ATTORNEY

CLINCHED-WIRE INTERCONNECTION DEVICE FOR PRINTED CIRCUIT BOARDS

BACKGROUND OF THE INVENTION

This invention relates generally to connectors for printed circuit boards and particularly to connectors adapted for directly mounting and electrically interconnecting two or more printed circuit boards.

To exploit more effectively the advantages of printed circuit construction, considerable effort has been directed towards the development of devices to replace the discreet intermediate connector conventionally used to interconnect printed circuit boards. Elimination of these separate connectors not only provides economies due to the absence of the cost of the connectors, but also savings in volume and structure compared to that required by separate connectors.

Efforts towards accomplishing board to board interconnection without an intermediate connector have taken several different approaches. One of these approaches involves a "W"-shaped socket which is soldered into plated holes in a receiving printed circuit board. Another approach provides cylindrical pins which mate with plated holes in the receiving board. Both of the just described prior art approaches require plated holes in the receiving board and the first-mentioned method requires fixturing of the "W"-shaped sockets during assembly—hence, increasing the cost of manufacture. The second-mentioned approach requires rather close tolerances between the pins and sockets. Both of the forementioned devices allow the pins of the "plugged-in" board to project columnwise from their mounts, and they are thereby vulnerable to damage.

SUMMARY OF THE INVENTION

Therefore it is an object of the invention to provide a reliable and economical connector for the direct mounting and electrical interconnection of printed circuit boards.

It is a further object to provide an improved monolithic printed circuit board interconnection device which is adapted to automatic assembly techniques, including wave or flow soldering.

It is another object to provide a compact interconnection device formed as an integral part of the printed circuit boards to be interconnected and which provides positive interconnections between the boards.

In general, in its preferred form, the present invention comprises a receiving printed circuit board which has a plurality of openings formed therein such that these openings are alignable with fingerlike insertion strips on other circuit boards to be plugged in. Wire segments are clinched and soldered to the receiving board so that curved portions of wire segments project from opposite sides of each of the openings. The spacing between oppositely disposed wire segments, associated with a particular opening, is slightly less than the width of the insertion strips of the plugged-in board, so that upon insertion of the plugged-in board, the clinched-wire segments are elastically distorted thereby providing positive contact with the insertion strips. The wire segments may be clinched to the receiving board by means of automatic machine techniques or otherwise; and subsequently the entire receiving board may be processed through a "mass soldering" assembly procedure which includes wave soldering.

BRIEF DESCRIPTION OF THE DRAWINGS

Other advantages of the invention will hereinafter become more fully apparent from the following detailed description of the drawings, which illustrate the preferred embodiment, and throughout which like referenced numerals indicate like parts, and in which.

DESCRIPTION OF THE PREFERRED EMBODIMENT

Figure 1:
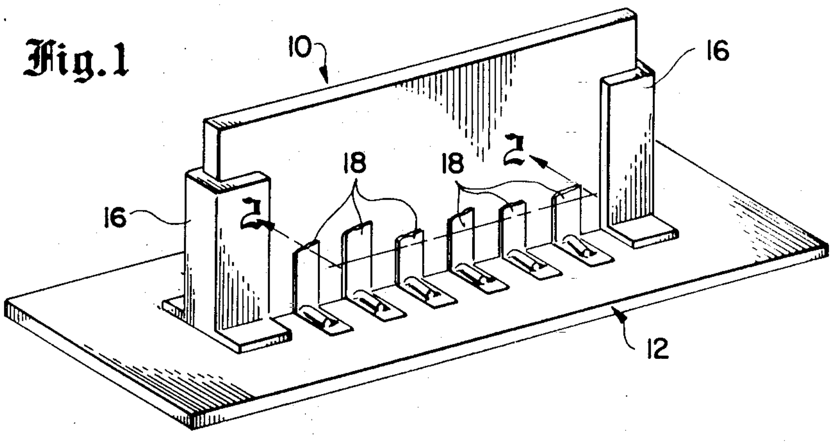
FIG. 1 is a perspective view of a pair of printed circuit boards directly interconnected by means of a connector device constructed in accordance with the principles of the subject invention.
Figure 2:
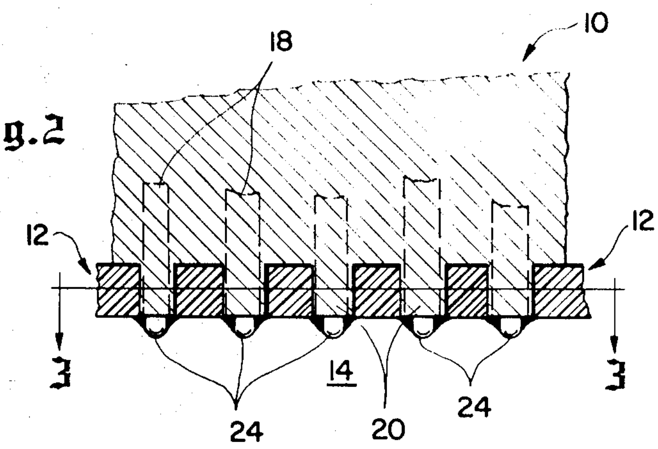
FIG. 2 is a partial vertical sectional view, taken along line 2-2 in FiG. 1, of a central portion of the connector device.

Referring now to the accompanying drawings, a printed circuit board 10 is orthogonally mounted to and electrically interconnected with, a receiving printed circuit board 12 by means of a receiving connector structure 14 formed in the board 12. Additional structural support is provided by channels 16, positioned to support opposite ends of the printed circuit board 10 and to guide the plugged-in board 10 into place.

The printed circuit boards 10 and 12 may be constructed from any suitable type of base material such as copper-clad phenolic sheet material or epoxy-glass copper-coated printed board base material. The conductive paths, terminal areas, and mounting ports or posts normally etched or formed into printed circuit boards are not particularly germane to the present invention and, hence, in the interests of clarity, are not shown in the drawings other than to indicate conductive paths 18 emanating from the fingerlike insertion strips 20.

The receiving connector structure 14, which is fundamental to the improved connector device of the subject invention, includes a plurality of openings 22 formed in the receiving printed circuit board 12. These openings may be conveniently punched or stamped into the board 12 after the etched conductive circuit patterns have been formed but before components have been added to the board. In the illustrated embodiment the openings 22 are rectangular in shape; however, it will be understood that the subject invention is not limited to this configuration.

The next step in the construction of the receiving connector 14 is the installation of resilient conductive wire segments, designated generally by reference numeral 24, at opposite ends of each opening 22. The wire segments 24 must exhibit sufficient spring action to maintain contact with the fingers 20 when the printed circuit boards 10 and 12 are connected. Spring wire composed of beryllium copper or phosphor bronze is preferable for elements 24.

Figures 3, 4, 5:
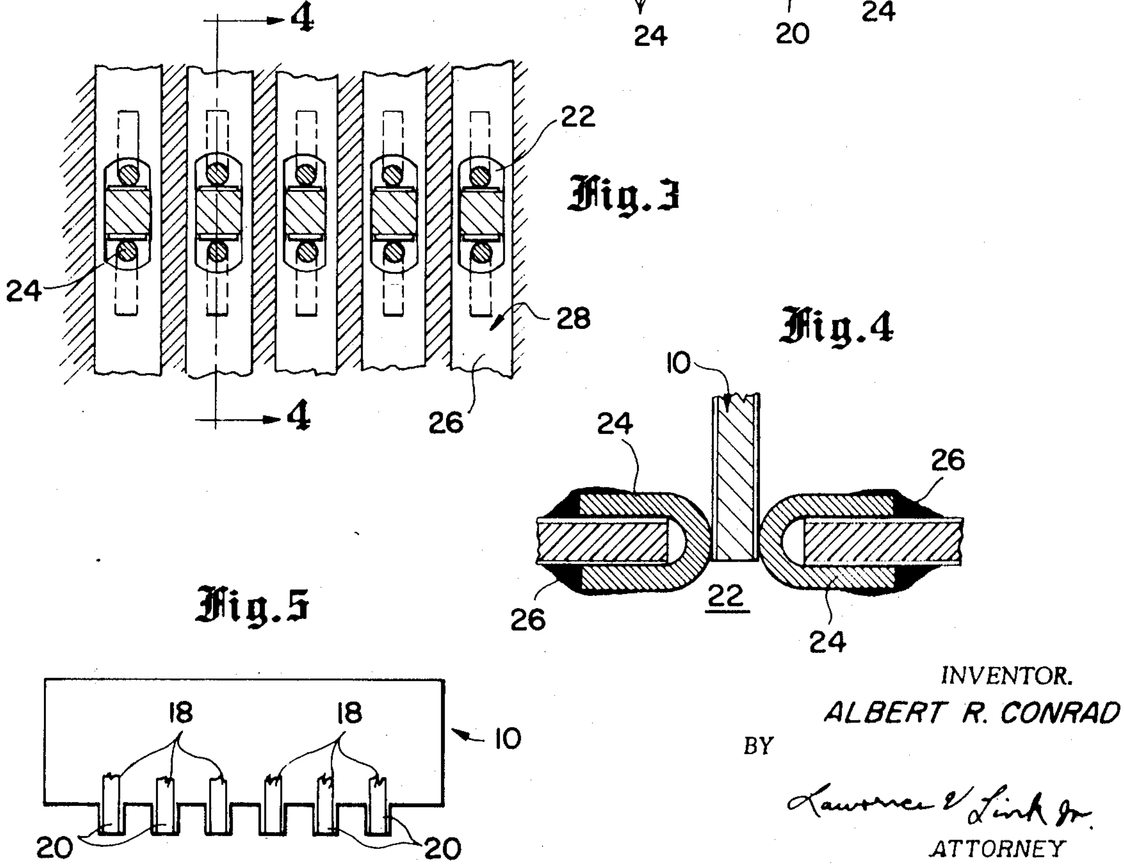
FIG. 3 is a sectional view taken at 3-3 in FIG. 2, showing horizontal sectional view of a portion of the connector device.
FIG. 4 is an enlarged sectional view taken at 4-4 in FIG. 3, for showing the relationship between the maintaining or clamping wire segments and the insertion strip of the plugged-in printed circuit board.
FIG. 5 is a side view of a printed circuit board adapted to be inserted into the receiving printed circuit board as shown in FIG. 1.

As shown in FiG. 4, the receiving connector 14 may be formed by inserting a pair of wire segments into each of the openings 22 and bending the top and bottom end portions of each wire segment so that the surfaces of the adjacent area on the printed circuit board 12 is clinched therebetween. After the wire segments are installed into adjacent opposite end portions of each opening, the wires 24 are then bonded to the adjacent portions of the board 12, shown by solder connection 26, thereby providing a low-resistance connection thereto.

The operation of clinching the wire segments to the board may be most economically performed by a clinching machine such as shown in an article entitled, "A Flexible Clinched-Wire Connection for Printed Wiring Boards," by Gutbrier and Schmidt which was published in the Nov. 1967 issue of the "SCP and Solid State Technology Magazine." It is noted that this just cited article relates to the connections between different layers of a single printed circuit board and not to the interconnection of separate printed circuit boards.

The clinching operation also provides a stable orientation of the retaining wires 24 such that the receiving connector structure 14 may be wave soldered as the board 12 is processed, without the need of a positioning fixture.

In the case of wave soldering, the entire wire segment 24 as well as the conductive terminal area 26 and the conductive paths 18 on the printed circuit board 12 will be solder coated.

The diameter of the wires 24 is selected relative to the size of the opening 22 so that the space between oppositely disposed wire segments, associated with a particular opening, is slightly less than the width of the fingerlike insertion strips 20. This just mentioned feature provides firm contact between the plugged-in board and the receiving board. Also the diameter of the wire 24 and, hence, the radius of curvature thereof ("U"-shaped in the illustrative embodiment), may be selected for a given opening size so that the proper tension may be obtained on the insertion strips of the printed circuit board 10.

It is noted that in FIG. 3, the pattern on the printed circuit board 12 in the area surrounding each of the openings 22 is etched to form a conductive border 28 around each of the openings. The border 28 provides electrical continuity between the oppositely disposed wire segments associated with a particular opening, thereby reducing contact resistance. However, when desired, the opposite surfaces of each insertion strip 20 may be electrically isolated, in which case the conductive border 28 may be eliminated.

While the basic principle of this invention has been herein illustrated along with one embodiment, it will be appreciated by those skilled in the art that variations in the disclosed arrangement both as to its details and as to the organization of such details may be made without departing from the scope and spirit thereof. For example, in the illustrated embodiment only one printed circuit board is plugged into the receiving board 12, but it will be recognized that a plurality of insertion boards may be utilized with a given master or receiving board. Also, it will be understood that either the inserted printed circuit board 10 or the receiving printed circuit board 12 may be of the multilayer type.

What is claimed is:

1. A connector device formed in a first printed circuit board and adapted to receive strips of a second printed circuit board for mounting and electrically interconnecting said first and second printed circuit boards, said connector comprising:
- a plurality of aligned openings formed in the first printed circuit board, said openings being alignable with the insertion strips of the second printed circuit board; and
- at least a separate pair of wire segments associated with each of said openings with opposite end portions of each wire segment mounted to upper and lower surfaces, respectively, of the first printed circuit board with a central portion of each wire segment projecting into the associated opening, and with said wire segments of each pair projecting from generally opposite sides of the associated opening, at least one of said wire segments of each pair being connected to a conductor on a surface on the first printed circuit board.

2. The device of claim 1 wherein the spacing between said projecting portions of each pair of wire segments is such that upon the insertion of the strips said wire segments elastically deform and thereby apply contact forces for electrically interconnecting said first and second printed circuit boards.

3. The device of claim 1 wherein said opposite end portions of each wire segment are clinched to the upper and lower surfaces, respectively, of said first printed circuit board.

4. The device of claim 1 wherein said opposite end portions of each wire segment are clinched and soldered to the upper and lower surfaces, respectively, of said first printed circuit board.

5. The device of claim 1 wherein said openings are of a general rectangular shape, said insertion strips are rectangularly shaped protruding fingers and said wire segments, of each pair of wire segments, are formed around opposing edges of said rectangular openings.

6. The device of claim 5 wherein the diameter of said wire segments relative to the thickness of said first printed circuit board is such that each said wire segment forms a generally "U"-shaped structure.

7. A connector system for directly mounting and electrically interconnecting printed circuit boards, said connector system comprising:
- a first printed circuit board having a plurality of openings formed therein;
- at least one second printed circuit board having a plurality of fingerlike insertion strips formed along one edge surface thereof, said insertion strips being alignable with the plurality of openings in said first circuit board;
- at least a separate pair of wire segments associated with each of said openings with opposite end portions of said wire segments engaging the upper and lower surfaces, respectively, of the first printed circuit board with a central portion of each wire segment projecting into the associated opening, and with said wire segments of each pair projecting from generally opposite sides of the associated opening; and wherein
- the spacing between said projecting portions of each pair of wire segments is such that upon insertion of the strips the wire segments elastically deform thereby applying contact forces for electrically interconnecting said first and second printed circuit boards.

8. The device of claim 7 wherein said opposite end portions of each wire segment are clinched and soldered to the upper and lower surfaces, respectively, of said first printed circuit board.

9. The method of forming a connector structure in a printed circuit board, said method comprising the steps of:
- forming a plurality of openings in said printed circuit board;
- clinching opposite end segments of resilient wire segments to the upper and lower surfaces, respectively, of said printed circuit board so that at least a separate pair of wire segments pass through each of said plurality of openings with a central portion of each wire portions projecting into the associated opening and with said wire segments of each pair projecting from generally opposite sides of the associated opening; and
- fastening said opposite end portions to the upper and lower surfaces, respectively, of said printed circuit board so that at least one end portion of a wire segment of each pair is connected to a conductor on a surface of said printed circuit board.

10. The method of claim 9 wherein said fastening step comprises wave soldering of said end portions to said printed circuit board.

* * * * *

PO-1050
(5/69)

UNITED STATES PATENT OFFICE
CERTIFICATE OF CORRECTION

Patent No. 3,624,587 Dated November 30, 1971

Inventor(s) Albert R. Conrad

It is certified that error appears in the above-identified patent and that said Letters Patent are hereby corrected as shown below:

Claim 1, column 3, line 32, after "receive" read --insertion--;

Claim 9, column 4, line 41, "segments" should read --portions--;

Claim 9, column 4, line 45, "portions" should read --segment--.

Signed and sealed this 25th day of April 1972.

(SEAL)
Attest:

EDWARD M.FLETCHER,JR.
Attesting Officer

ROBERT GOTTSCHALK
Commissioner of Patents